(12) United States Patent
Nair et al.

(10) Patent No.: US 6,456,133 B1
(45) Date of Patent: Sep. 24, 2002

(54) DUTY CYCLE CONTROL LOOP

(75) Inventors: Rajendran Nair, Hillsboro; Chantal Wright, Portland; Stephen Mooney; Siva G. Narendra, both of Beaverton, all of OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/752,250

(22) Filed: Dec. 28, 2000

(51) Int. Cl.[7] ............................................. H03K 3/017
(52) U.S. Cl. ...................................... 327/175; 327/173
(58) Field of Search ................................ 327/175, 173, 327/174, 170, 178, 35, 48, 165, 104

(56) References Cited

U.S. PATENT DOCUMENTS 4,160,922 A * 7/1979 Rickenbacker .............. 327/104
4,959,557 A * 9/1990 Miller ........................ 327/175
5,397,945 A * 3/1995 Shum et al. ................. 327/175
5,907,254 A * 5/1999 Chang ........................ 327/165

* cited by examiner

Primary Examiner—Timothy P. Callahan
Assistant Examiner—Linh Nguyen
(74) Attorney, Agent, or Firm—Blakely, Sokoloff, Taylor & Zafman LLP

(57) ABSTRACT

An output circuit generates an output signal. The output signal has a duty cycle from an input signal. A level extractor couple to the output circuit to extract a direct current (DC) level from the output signal. The DC level is a representative of the duty cycle. An integrator couple to the level extractor to integrate the DC level. The integrator generates a current control signal to adjust the duty cycle.

30 Claims, 5 Drawing Sheets

DUTY CYCLE CONTROL LOOP

BACKGROUND

1. Field of the Invention

This invention relates to clock generation. In particular, the invention relates to the control of duty cycle of the clock signal.

2. Description of Related Art

Clock signals are basic elements in digital circuits. A clock signal may be used to trigger flip-flops, serve as a timing reference, provide data and address strobing, and perform many other timing and control functions. Since a clock signal may be connected to a number of circuit elements, it is usually buffered to increase the driving capability.

A clock signal may be generated by a number of methods including use of a phase-lock loop (PLL). It is desirable that the duty cycle of the clock signal to be approximately 50%. To distribute the clock signal to various circuit elements, a clock distribution circuit is used. The clock distribution circuit usually uses inverters or buffers. Variations in the P and N devices of the distribution inverters or clock skew due to buffers tend to distort the duty cycle.

Existing techniques to maintain a balanced duty cycle of 50% include using manual control of current sources. These techniques have a number of drawbacks. First, as processes scale down and supply voltage decreases, the headroom used by the series current sources significantly decreases the range of control. Second, there is non-linearity at the ends of the control range.

BRIEF DESCRIPTION OF THE DRAWINGS

The features and advantages of the present invention will become apparent from the following detailed description of the present invention in which.

DESCRIPTION

In the following description, for purposes of explanation, numerous details are set forth in order to provide a thorough understanding of the present invention. However, it will be apparent to one skilled in the art that these specific details are not required in order to practice the present invention. In other instances, well-known electrical structures and circuits are shown in block diagram form in order not to obscure the present invention.

Figure 1:
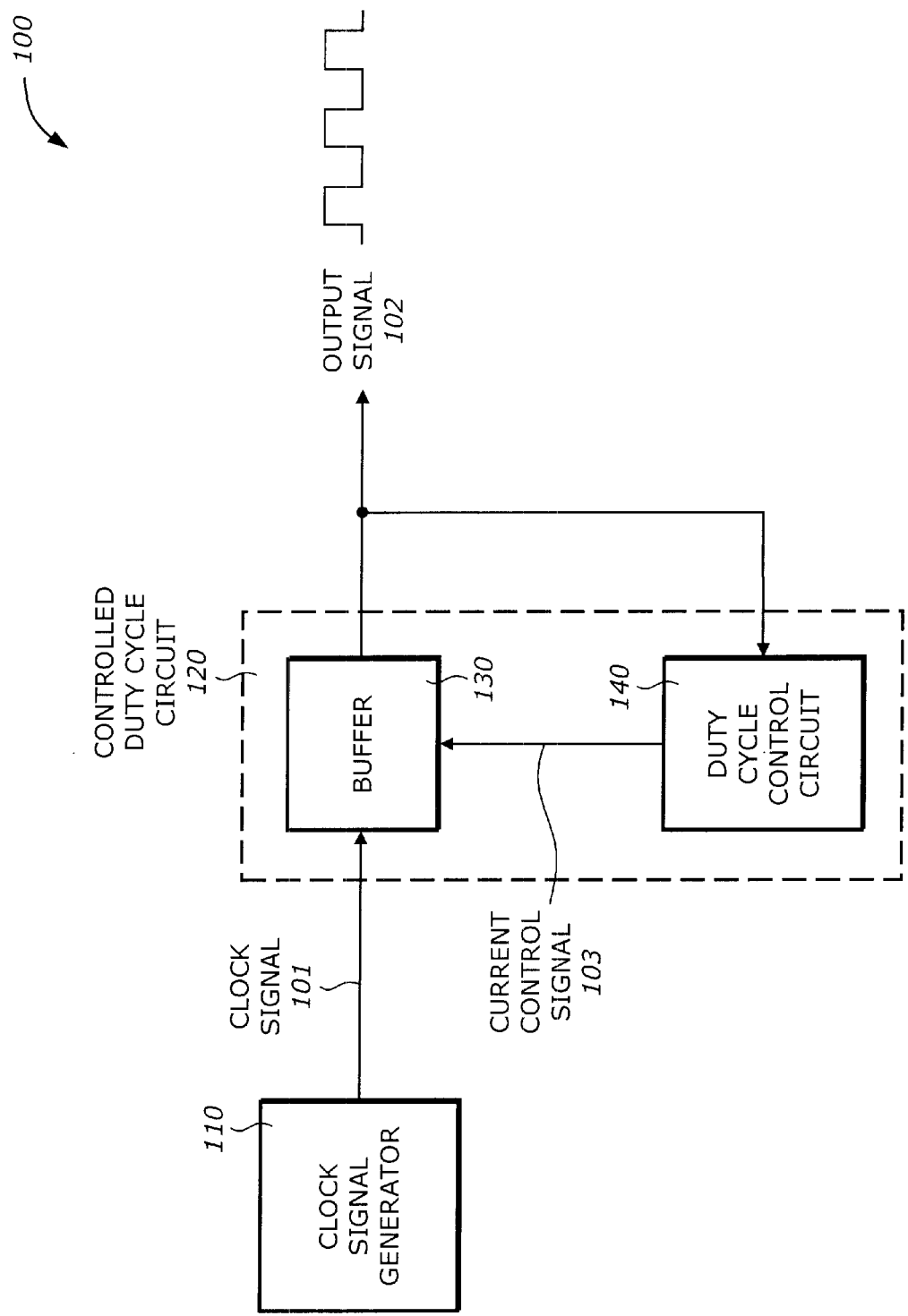
FIG. 1 is a diagram illustrating a system in which one embodiment of the invention can be practiced.

FIG. 1 is a diagram illustrating a system 100 in which one embodiment of the invention can be practiced. The system 100 includes a clock signal generator 110 and a controlled duty cycle circuit 120.

The clock signal generator 110 may be any circuit that generates a signal having a duty cycle that is controlled by the circuit 120. Examples of the clock signal generator 110 include phase locked loop circuit, delayed locked loop circuit, etc. The clock signal generator 110 generates a clock signal 101 which may be a clock signal having high and low periods. The clock signal 101 has a frequency and a duty cycle. The duty cycle is defined as the ratio between the high period over the entire period of the signal. The duty cycle of the clock signal 101 may range from 10% to 90% although 40% to 60% is typical. It is desired to have an approximately 50% (e.g., 45% to 55%) duty cycle so that operations using the clock signal 101 can be reliably performed.

The controlled duty cycle circuit 120 distributes the clock signal 101 to other circuits. The circuit 120 receives the clock signal 101 and generates an output signal 102. The circuit 120 helps increase the driving capability of the clock signal 101 and also maintains an approximately 50% duty cycle. By selecting proper components, the circuit 120 may maintain any desired duty cycle and is not limited to 50%. The circuit 120 regulates the duty cycle of the output signal 102 using a feedback mechanism.

The controlled duty cycle circuit 120 includes an output circuit 130 and a duty cycle control circuit 140. The output circuit 130 receives the clock signal 101 and generates the output signal 102 according to a current control signal 103 from the duty cycle control circuit 140. The duty cycle control circuit 140 receives the output signal 102 in a feedback path and generates the current control signal 103 based on the output signal 102.

Figure 2A:
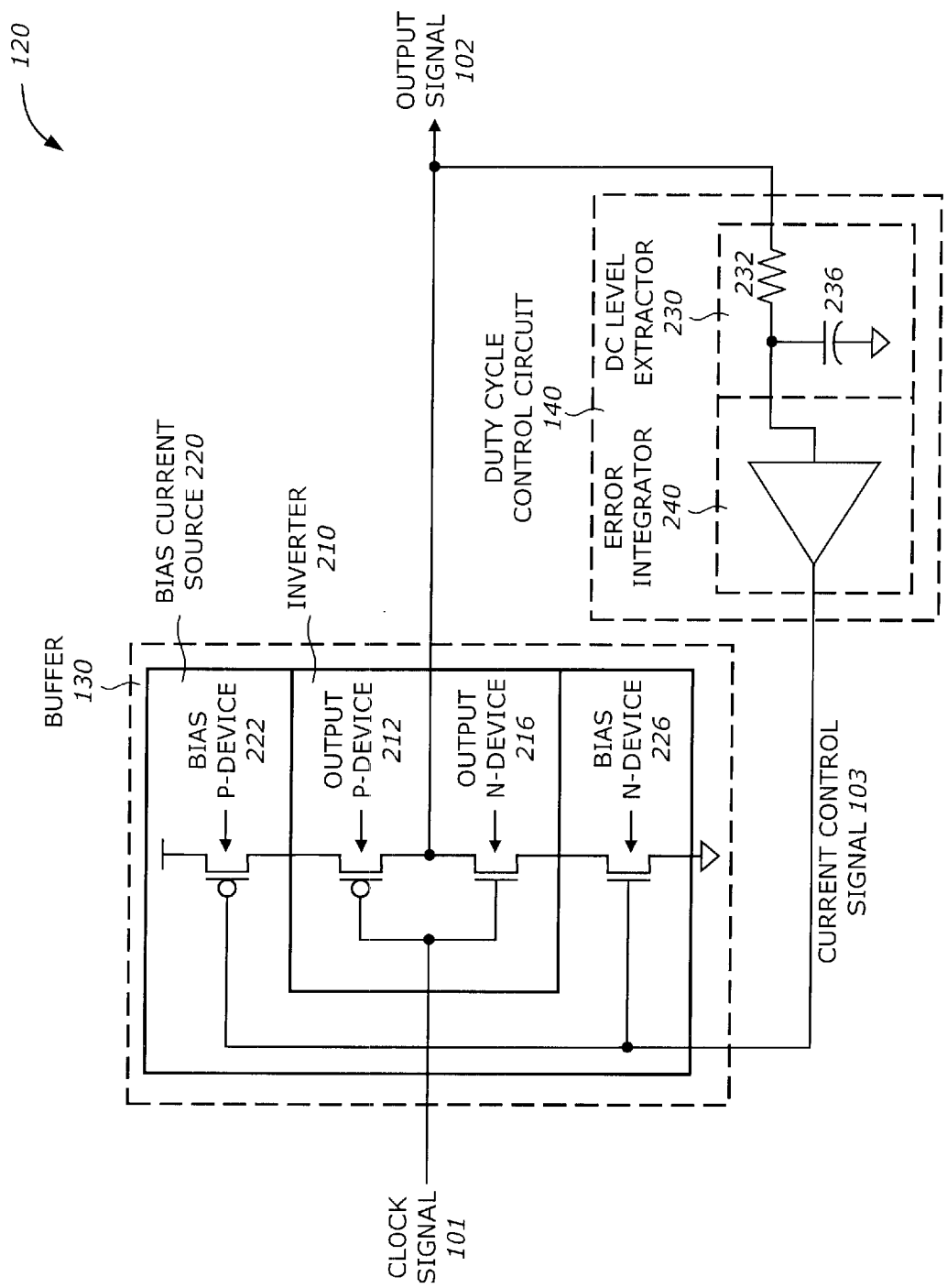
FIG. 2A is a diagram illustrating a controlled duty cycle circuit shown in FIG. I using a common duty cycle controller according to one embodiment of the invention.

FIG. 2A is a diagram illustrating the controlled duty cycle circuit 120 shown in FIG. 1 using a common duty cycle controller according to one embodiment of the invention. The circuit 120 includes the output circuit 130 and the duty cycle control circuit 140 as shown in FIG. 1.

The output circuit 130 includes an output device or inverter 210 and a bias current source 220. The output device 210 operates as an inverter which inverts the clock signal 101 to generate the output signal 102. The inverter 210 may be a buffer. The inverter 210 includes an output p-device 212 and an output n-device 216 operating as an inverter as is known by one skilled in the art. The bias current source 220 provides a bias current to the inverter 210 using the current control signal 103 from the duty cycle control circuit 140. The bias current source 220 adjusts the duty cycle of the output signal 102. The bias current source 220 includes a bias p-device 222 and a bias n-device 226. The bias p-device 222 is coupled to the output p-device 212 to adjust a p-current according to the current control signal 103. The bias n-device 226 is coupled to the output n-device 216 to adjust an n-current according to the current control signal 103. The p-current and the n-current form the bias current. In the embodiment shown in FIG. 2A, the current control signal 103 from the duty cycle control circuit 140 is connected to the gates of the bias p-device 222 and the bias n-device 226 such that the current control signal 103 controls the bias p-device 222 and the bias n-device 226, respectively, in a complementary mode.

The duty cycle control circuit 140 includes a direct current (DC) level extractor 230 and an error integrator 240. The DC level extractor 230 filters the output signal 102 to eliminate high frequency components and to retain the DC component. In one ernbodiment, the DC level extractor 230 operates as a low pass filter. The DC level extractor 230 essentially extracts a DC level representative of the duty cycle of the output signal 102. The DC level extractor 230 includes a resistor 232 and a capacitor 236. As is known by one skilled in the art, any other configuration of the DC level extractor 230 may be used. The error integrator 240 integrates the extracted signal to provide the current control signal 103. The error integrator 240 includes an amplifier operating as an integrator.

The control of the duty cycle is performed automatically without manual adjustment. When the duty cycle of the output signal 102 deviates from the desired duty cycle, the duty cycle control circuit 140 automatically senses the deviation and generates an appropriate amount of current control signal 103 to counter act the increase or decrease of the generated duty cycle. For example, if the high period of the clock signal 101 is longer than the low period, then the duty cycle control circuit 140 generates the current control signal 103 such that the bias currents adjust the inverter 210 to reduce the high period and increase the low period. Since the duty cycle control circuit 140 senses the output signal 102 directly in a feedback path, any deviation from the desired duty cycle will be automatically adjusted and corrected appropriately.

Figure 2B:
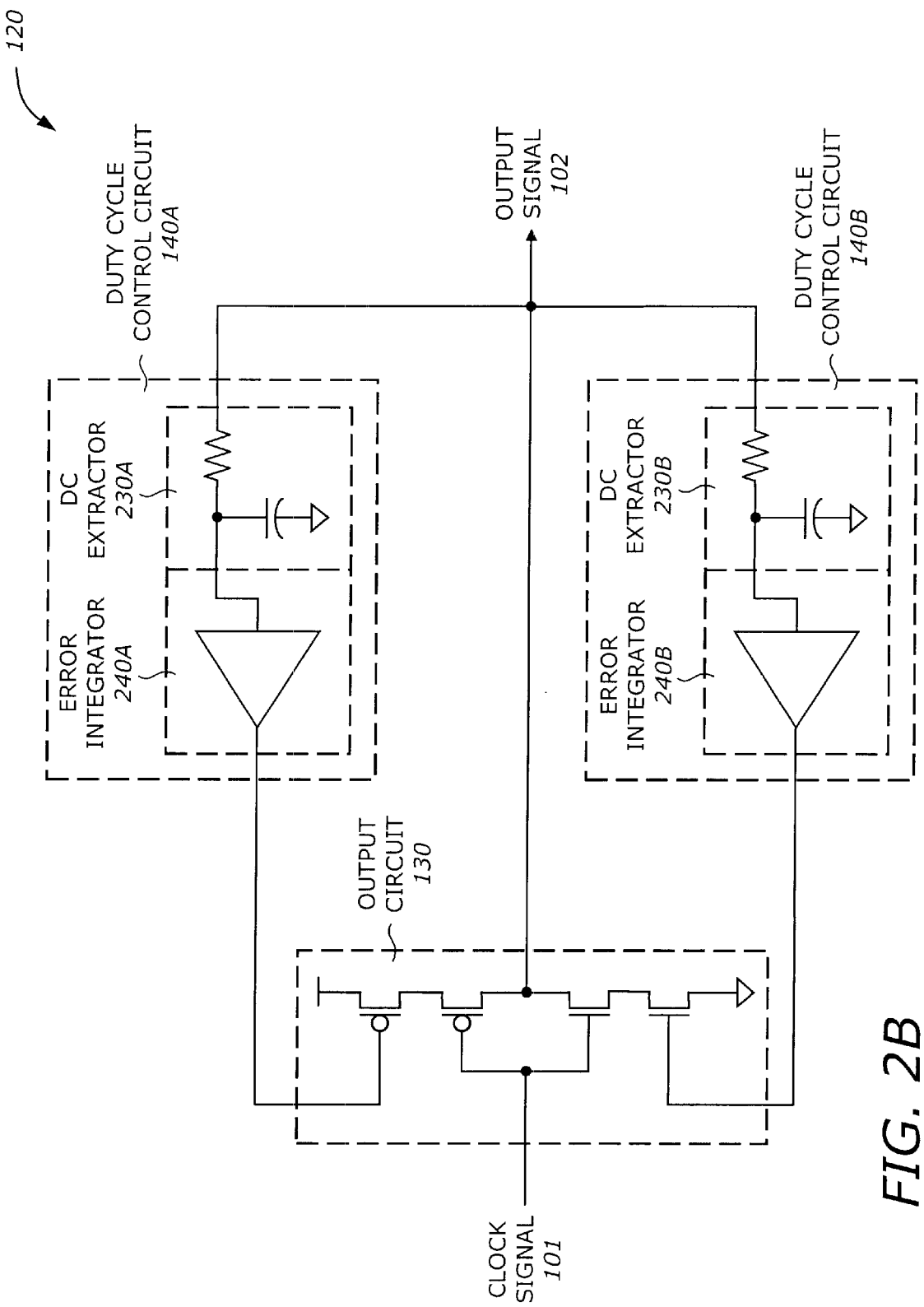
FIG. 2B is a diagram illustrating a controlled duty cycle circuit shown in FIG. I using separate duty cycle controllers according to one embodiment of the invention.

FIG. 2B is a diagram illustrating a controlled duty cycle circuit 120 shown in FIG. 1 using separate duty cycle controllers according to one embodiment of the invention. The embodiment shown in FIG. 2B is essentially the same as the embodiment shown in FIG. 2A except that two separate duty control circuits are used to control the bias devices separately.

The circuit 120 includes duty cycle control circuits 140A and 140B. The duty cycle control circuits 140A and 140B control the bias p-device 222 and 226, respectively, in the output circuit 130. By selecting the components of the duty cycle control circuits 140A and 140B appropriately, the bias currents may be generated to maintain a desired duty cycle of the output signal 102.

Figure 3:
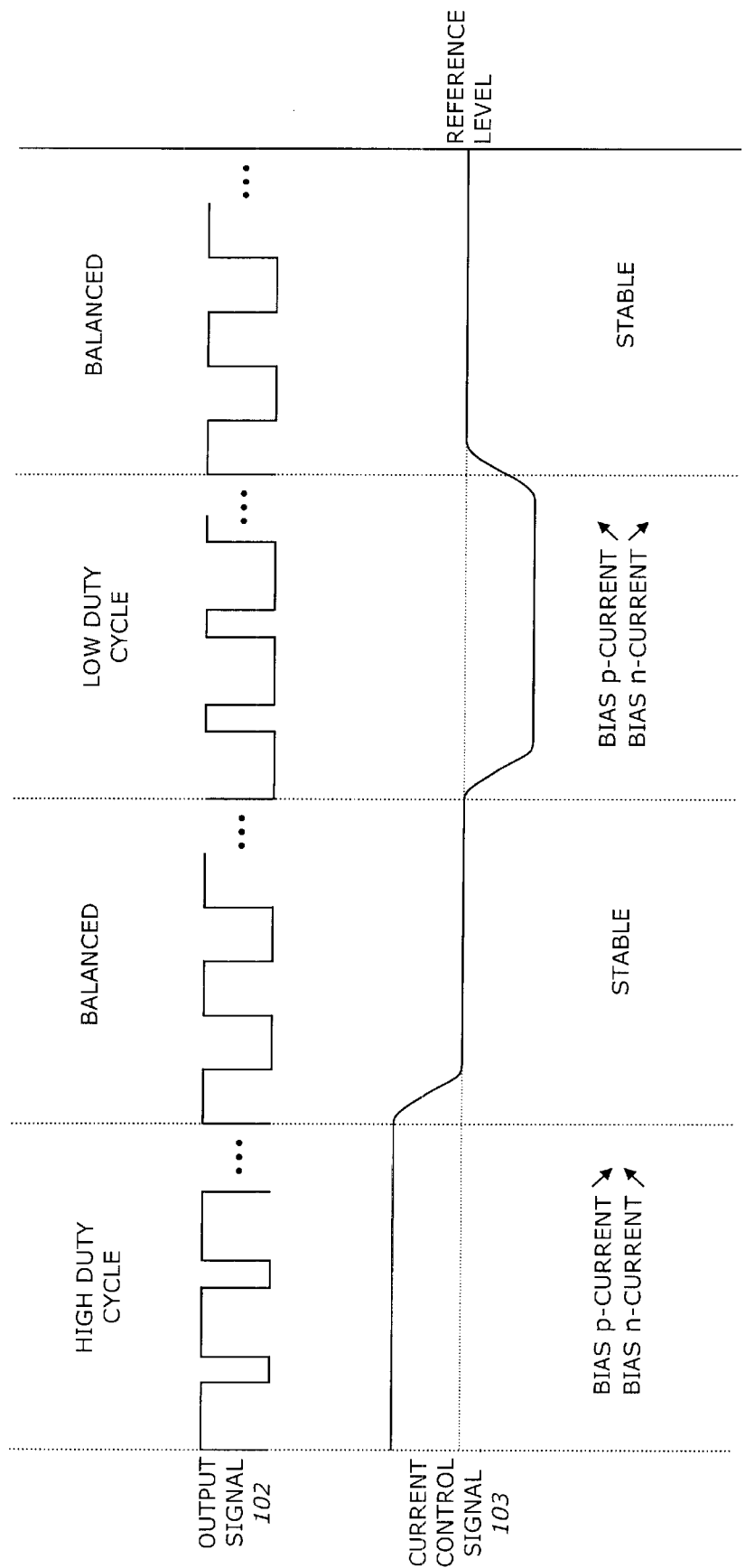
FIG. 3 is a timing diagram illustrating control of duty cycle using rise and fall currents according to one embodiment of the invention.

FIG. 3 is a timing diagram illustrating control of duty cycle using rise and fall currents according to one embodiment of the invention. The timing diagram illustrates the adjustment of the output signal 102 to achieve a desired duty cycle.

The timing diagram shows four episodes: a high duty cycle episode, a balanced episode, a low duty cycle episode, and a balanced mode episode. In the high duty cycle episode, the output signal 102 has longer high interval then low interval. The feedback mechanism provided by the duty cycle control circuit 140 (FIGS. 2A and 2B) generates the current control signal 103 such that the bias p-current is reduced while the bias n-current is increased. The effect of this complementary operation reduces the high interval while increasing the low interval with approximately equal amount to achieve an approximately 50% duty cycle, or when separate duty cycle control circuits are used, the high and low intervals will be adjusted accordingly to achieve the desired duty cycle. Eventually, when the desired duty cycle is achieved, the current control signal 103 is at a stable level without further change and the output signal 102 is in the balanced episode. Similarly, in the low duty cycle episode, the output signal 102 has shorter high interval then low interval. The feedback mechanism provided by the duty cycle control circuit 140 (FIGS. 2A and 2B) generates the current control signal 103 such that the bias p-current is increased while the bias n-current is reduced. The effect of this complementary operation increases the high interval while decreasing the low interval with approximately equal amount to achieve an approximately 50% duty cycle, or when separate duty cycle control circuits are used, the high and low intervals will be adjusted accordingly to achieve the desired duty cycle. Eventually, when the desired duty cycle is achieved, the current control signal 103 is at a stable level without further change and the output signal 102 is in the balanced episode.

Figure 4:
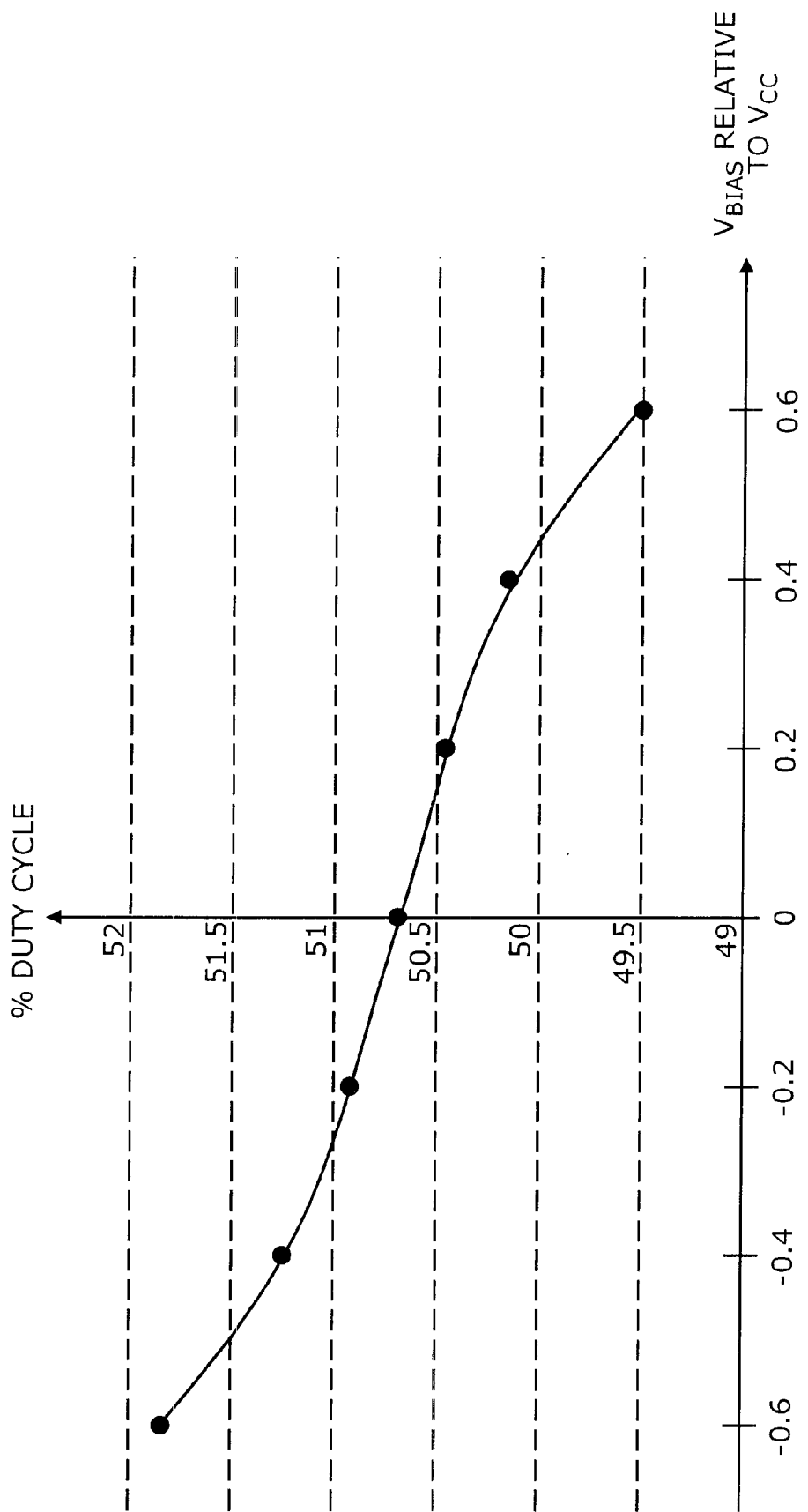
FIG. 4 is a diagram illustrating relationship between duty cycle and bias voltage according to one embodiment of the invention.

FIG. 4 is a diagram illustrating the relationship between duty cycle and bias voltage according to one embodiment of the invention.

The diagram shows the variation of the duty cycle of the output signal 102 as a function of the bias voltage relative to the supply voltage. The relative bias voltage is representative of the bias current as discussed above. As the relative bias voltage changes from –0.6V to +0.6V, the duty cycle is reduced from 51.75% to 49.5%. When the relative bias voltage is near zero volt, the duty cycle reaches approximately 50.5%.

While this invention has been described with reference to illustrative embodiments, this description is not intended to be construed in a limiting sense. Various modifications of the illustrative embodiments, as well as other embodiments of the invention, which are apparent to persons skilled in the art to which the invention pertains are deemed to lie within the spirit and scope of the invention.

What is claimed is:

1. An apparatus comprising:
   an output circuit to generate an output signal having a duty cycle from an input signal, the output circuit having a bias p-device and a bias n-device;
   a first level extractor coupled to the bias p-device to extract a direct current (DC) level from the output signal, the DC level being representative of the duty cycle;
   a second level extractor coupled to the bias n-device to extract the direct current (DC) level from the output signal, the DC level being representative of the duty cycle;
   a first integrator coupled to the first level extractor to integrate the DC level, the first integrator generating a current control signal to adjust the duty cycle; and
   a second integrator coupled to the second level extractor to integrate the DC level, the second integrator generating the current control signal to adjust the duty cycle.

2. The apparatus of claim 1 wherein the output circuit comprises:
   an output device to provide the output signal according to the input signal; and
   a bias current source coupled to the output device, the first integrator, and the second integrator to provide bias current to the output device using the current control signal, the bias current adjusting the duty cycle of the output signal.

3. The apparatus of claim 2 wherein the output device comprises:
   an output p-device; and
   an output n-device coupled to the output p-device to form an inverter, the inverter inverting the input signal.

4. The apparatus of claim 3 wherein the bias current source comprises:
   the bias p-device coupled to the output p-device to adjust a p-current according to the current control signal; and
   the bias n-device coupled to the output n-device to adjust an n-current according to the current control signal, the p-current and the n-current forming the bias current.

5. The apparatus of claim 3 wherein the first and second integrator comprise:
   a p-integrator coupled to a first low-pass filter to generate a p-control signal; and an n-integrator coupled to a second low-pass filter to generate an n-control signal, the p-control and the n-control signals forming the current control signal.

6. The apparatus of claim 5 wherein the bias current source comprises:
the bias p-device coupled to the output p-device to adjust a p-current according to the p-control signal; and
the bias n-device coupled to the output n-device to adjust an n-current according to the n-control signal, the p-current and the n-current forming the bias current.

7. The apparatus of claim 4 wherein the current control signal controls the bias p-device and the bias n-device in a complementary mode.

8. The apparatus of claim 6 wherein the p-control signal and the n-control signal controls the bias p-device and the bias n-device, respectively, in a complementary mode.

9. The apparatus of claim 4 wherein a change in the p-current corresponds to an opposite change in the n-current such that the duty cycle of the output signal remains substantially constant.

10. The apparatus of claim 6 wherein a change in the p-current corresponds to an opposite change in the n-current such that the duty cycle of the output signal remains substantially constant.

11. A method comprising:
generating an output signal having a duty cycle from an input signal by an output circuit;
extracting a direct current (DC) level from the output signal, the DC level being representative of the duty cycle; and
integrating the DC level with a first duty cycle control circuit and a second duty cycle control circuit to respectively generate a first current control signal and a second current control signal, the first and second current control signal adjusting the duty cycle.

12. The method of claim 11 wherein generating comprises:
providing the output signal according to the input signal by an output device; and
providing bias current to the output device using the current control signal by a bias current source, the bias current adjusting the duty cycle of the output signal.

13. The method of claim 12 wherein providing the output signal comprises:
inverting the input signal by an output p-device and an output n-device.

14. The method of claim 13 wherein providing bias current comprises:
adjusting a p-current according to the first current control signal by a bias p-device; and
adjusting an n-current according to the second current control signal by a bias n-device, the p-current and the n-current forming the bias current.

15. The method of claim 13 wherein integrating comprises:
generating a p-control signal by a p-integrator; and
generating an n-control signal by an n-integrator, the p-control and the n-control signals forming the first and second current control signal.

16. The method of claim 15 wherein providing bias current comprises:
adjusting a p-current according to the p-control signal by a bias p-device; and
adjusting an n-current according to the n-control signal by a bias n-device, the p-current and the n-current forming the bias current.

17. The method of claim 14 wherein integrating comprises controlling the bias p-device and the bias n-device in a complementary mode.

18. The method of claim 16 wherein the p-control signal and the n-control signal control the bias p-device and the bias n-device, respectively, in a complementary mode.

19. The method of claim 14 wherein a change in the p-current corresponds to an opposite change in the n-current such that the duty cycle of the output signal remains substantially constant.

20. The method of claim 16 wherein a change in the p-current corresponds to an opposite change in the n-current such that the duty cycle of the output signal remains substantially constant.

21. A system comprising:
a clock signal generator to generate a clock signal;
an output circuit coupled to the clock signal generator to generate an output signal having a duty cycle from the clock signal; and
a first duty cycle control circuit coupled to the output circuit to control the duty cycle of the output signal comprising:
a first level extractor coupled to the output circuit to extract a direct current (DC) level from the output signal, the DC level being representative of the duty cycle, and
a first integrator coupled to the level extractor to integrate the DC level, the first integrator generating a current control signal to adjust the duty cycle; and
a second duty cycle control circuit coupled to the output circuit to control the duty cycle of the output signal comprising:
a second level extractor coupled to the output circuit to extract a direct current (DC) level from the output signal, the DC level being representative of the duty cycle, and
a second integrator coupled to the level extractor to integrate the DC level, the second integrator generating a current control signal to adjust the duty cycle.

22. The system of claim 21 wherein the output circuit comprises:
an output device to provide the output signal according to the input signal; and
a bias current source coupled to the output device, the first integrator, and the second integrator to provide bias current to the output device using the current control signal, the bias current adjusting the duty cycle of the output signal.

23. The system of claim 22 wherein the output device comprises:
an output p-device; and
an output n-device coupled to the output p-device to form an inverter, the inverter inverting the input signal.

24. The system of claim 23 wherein the bias current source comprises:
a bias p-device coupled to the output p-device to adjust a p-current according to the current control signal; and
a bias n-device coupled to the output n-device to adjust an n-current according to the current control signal, the p-current and the n-current forming the bias current.

25. The system of claim 23 wherein the first and second integrator comprises:
a p-integrator coupled to a first low-pass filter to generate a p-control signal; and an n-integrator coupled to a second low-pass filter to generate an n-control signal, the p-control and the n-control signals forming the current control signal.

26. The system of claim 25 wherein the bias current source comprises:
a bias p-device coupled to the output p-device to adjust a p-current according to the p-control signal; and
a bias n-device coupled to the output n-device to adjust an n-current according to the n-control signal, the p-current and the n-current forming the bias current.

27. The system of claim 24 wherein the current control signal controls the bias p-device and the bias n-device in a complementary mode.

28. The system of claim 26 wherein the p-control signal and the n-control signal controls the bias p-device and the bias n-device, respectively, in a complementary mode.

29. The system of claim 24 wherein a change in the p-current corresponds to an opposite change in the n-current such that the duty cycle of the output signal remains substantially constant.

30. The system of claim 26 wherein a change in the p-current corresponds to an opposite change in the n-current such that the duty cycle of the output signal remains substantially constant.

* * * * *